(12) United States Patent
Liou

(10) Patent No.: US 6,760,263 B2
(45) Date of Patent: Jul. 6, 2004

(54) METHOD AND DEVICE FOR CONTROLLING DATA LATCH TIME

(75) Inventor: Ming-Shi Liou, Taipei Hsien (TW)

(73) Assignee: VIA Technologies, Inc., Taipei (TW)

( * ) Notice: Subject to any disclaimer, the term of this patent is extended or adjusted under 35 U.S.C. 154(b) by 107 days.

(21) Appl. No.: 10/248,198

(22) Filed: Dec. 26, 2002

(65) Prior Publication Data

US 2003/0179611 A1 Sep. 25, 2003

(30) Foreign Application Priority Data

Mar. 22, 2002 (TW) ....................................... 91105534 A

(51) Int. Cl.⁷ ............................................. G11C 7/00
(52) U.S. Cl. ..................... 365/193; 365/194; 365/191; 365/189.07; 365/189.05; 365/233
(58) Field of Search ................................. 365/193, 194, 365/191, 189.07, 189.05, 233

(56) References Cited

FOREIGN PATENT DOCUMENTS

| TW | 318223 | 10/1997 |
| TW | 424360 | 3/2001 |

*Primary Examiner*—Connie C. Yoha
(74) *Attorney, Agent, or Firm*—Jiang Chyun IP Office

(57) ABSTRACT

A method and device for controlling the data latch time. The method dynamically adjusts the latch time of the data strobe signal, so that the offset generated in the memory data signal or the data strobe signal due to the interference that results from the factors of the temperature variance or the voltage variance that impacts to the control chip and thus causes the inaccurate reading of the memory data can be avoided.

24 Claims, 2 Drawing Sheets

METHOD AND DEVICE FOR CONTROLLING DATA LATCH TIME

CROSS REFERENCE TO RELATED APPLICATIONS

This application claims the priority benefit of Taiwan application serial no. 91105534, filed Mar. 22, 2002.

BACKGROUND OF INVENTION

1. Field of Invention

The present invention generally relates to a method and device for controlling data, and more particularly, to a method and device for controlling data latch time.

2. Description of Related Art

The control circuit for reading the Synchronous Dynamic Random Access Memory (SDRAM) of the control chip in the currently used personal computer system can set the default Column Address Strobe Latency (abbreviated as CL) value. The function of the CL value is: when the memory control chip issues the memory read command, the control chip cannot receive the Data Strobe Signal (abbreviated as DQS) and the accurate memory data send from memory until a delay that equals CL times of the clock period. For example, if CL value equals 2, when memory issues the read command, the control chip cannot receive the data strobe signal (DQS) sent from memory until and memory data from memory after a delay of two times of the memory clock signal DCLK period.

Therefore, when the control chip intends to read the data in memory, it issues the memory read command first, then it receives the DQS signal sent from memory after a delay that equals CL times of the clock period. After the control chip receives the DQS signal, it delays the received DQS signal for a certain duration, after the delay, the control chip uses the delayed DQS signal to truly latch the Memory Data (abbreviated as MD) signal. In the Double Data Rate (abbreviated as DDR) memory, the memory data signal MD is latched based on the rising edge and the falling edge of the DQS signal. Wherein, the data strobe signal DQS comprises DQS[8:0], the memory data signal MD comprises MD[71:0]. Each DQS line corresponds to a byte of MD. For example, DQS0 corresponds to MD[7:0].

The reason for using the delayed DQS signal to latch the MD signal mentioned above is mainly because the memory data signal MD and the data strobe signal DQS sent from memory are edge align. However, to read the data successfully, the data should be stable on the rising edge and the falling edge of the data strobe signal DQS, so the control chip has to delay the data strobe signal DQS for certain duration, so that the memory data can be ensured to be read correctly. However, no matter whether the delay time of the data strobe signal DQS is too much or too little, it results in the inaccurate reading of the memory data. Therefore, it is a very important matter to properly adjust the phase difference between the data strobe signal DQS and the memory data signal MD, that is to have the rising edge and the falling edge of the data strobe signal DQS fall into a stable area of MD, so that the memory data signal MD can be read accurately. Moreover, since the clock frequency of the currently used memory is getting higher now, when it suffers from the interference that results from the factors of the temperature variance or the voltage variance, it is easier to result in the inaccurate reading of the memory data that will cause risk of system halt. Therefore, how to conquer the inaccurate reading of the memory data that results from noise and to instantly adjust the proper delay time of the data strobe signal DQS has become a very important matter.

As shown in FIG. 1, the conventional method to read memory data latches the memory data signal MD by using a data strobe signal DQS that is delayed for a fixed duration equal to ¼ period of the memory clock signal DCLK. However, when the memory or the control chip suffers from the interference that results from the factors of the temperature variance or the voltage variance, this results in the offset of the memory data signal MD or the data strobe signal DQS that has just been read, thus causing the inaccurate latch of the memory data signal MD. The reason for this is the control chip cannot instantly adjust the delay time of the data strobe signal DQS, thus the memory data signal MD is not accurately latched. Moreover, if the conventional control chip has the capability to adjust the controlled delay time by using the controlled delay value, since the controlled delay value is set only once based on the default value by BIOS when the system initializes, after the system is turned on, when the system suffers from interference that results from the factors of the environment, element state, circuit layout, temperature or pressure the result is the inaccurate reading of the memory data. Since the control chip cannot instantly adjust the controlled delay time, the accuracy of the reading data cannot be improved. In summary, the prior art has following disadvantages:

1. The fixed controlled delay value equals to ¼ period of the memory clock can not be instantly adjusted, so the accuracy of the reading data cannot be improved.

2. The controlled delay value is set only once based on the default value by BIOS when the system initializes, so when the system suffers from interference that results from the factors of the environment, element state, circuit layout, temperature or pressure the result is the inaccurate reading of the memory data. Since the control chip cannot instantly adjust the controlled delay time, the accuracy of the reading data cannot be improved.

SUMMARY OF INVENTION

Therefore, the present invention provides a method and device for controlling data latch time. When the system suffers from the interference that results from the factors of temperature variance or voltage variance resulting in the offset of the memory data, the control chip of the present invention can instantly adjust the controlled delay value to ensure the accuracy of the read memory data.

In order to achieve the above and other objectives, the present invention provides a device for controlling the data latch time. The device comprises a delay value controller, a back edge data comparison circuit, a front edge data comparison circuit, and a state unit. Wherein, the delay value controller provides a controlled delay value. The back edge data comparison circuit receives a first data strobe signal and a first data signal, delays the first data strobe signal and sequentially latches the first data on the first data signal and performs comparison, according to respectively the controlled delay value and a value of a first offset added to the controlled delay value. The front edge data comparison circuit receives a second data strobe signal and a second data signal, delays the second data strobe signal and sequentially latches the second data on the second data signal and performs comparison, according to respectively the controlled delay value and a value of a second offset subtracted from the controlled delay value. The state unit receives a first comparison result of the front edge data comparison circuit and a second comparison result of the back edge data comparison circuit, provides the decision to the delay value controller for dynamically adjusting the controlled delay value.

The present invention further provides a method for controlling the data latch time, comprising the steps of: Providing a controlled delay time to delay a first data strobe signal for a duration equal to the controlled delay time and latching a first data on a first data line after the delay; delaying a second data strobe signal for a duration equal to the controlled delay time and latching a second data on a second data line after the delay. Providing a back edge controlled delay time to delay the data strobe signal for a duration equal to the back edge controlled delay time and latching a third data on the first data line after the delay, wherein the back edge controlled delay time is greater than the controlled delay time by a value equal to a first offset. Providing a front edge controlled delay time to delay the data strobe signal for a duration equal to the front edge controlled delay time and latching a fourth data on the second data line after the delay, wherein the front edge controlled delay time is less than the controlled delay time by a value equal to a second offset. Decreasing the delay control time when the first data is not equal to the third data. Moreover, increasing the delay control time when the second data is not equal to the fourth data.

In summary, when the system suffers from interference resulting from the factors of temperature variance or voltage variance that results in the inaccurate reading of the memory data, the control chip of the present invention can instantly adjust the controlled delay time to ensure the accurate reading of the memory data.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a case in the prior art wherein the data on the memory data signal MD is latched by the data strobe signal DQS delayed for duration equal to ¼ period of the memory clock signal DCKL.

DETAILED DESCRIPTION

Figure 1:
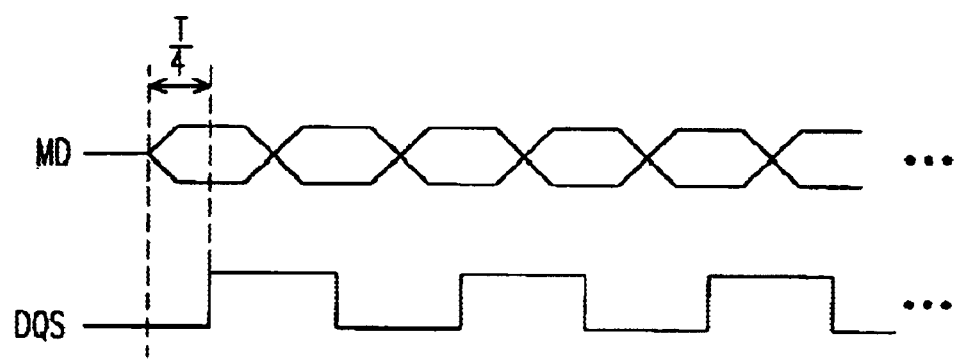
Figure 2:
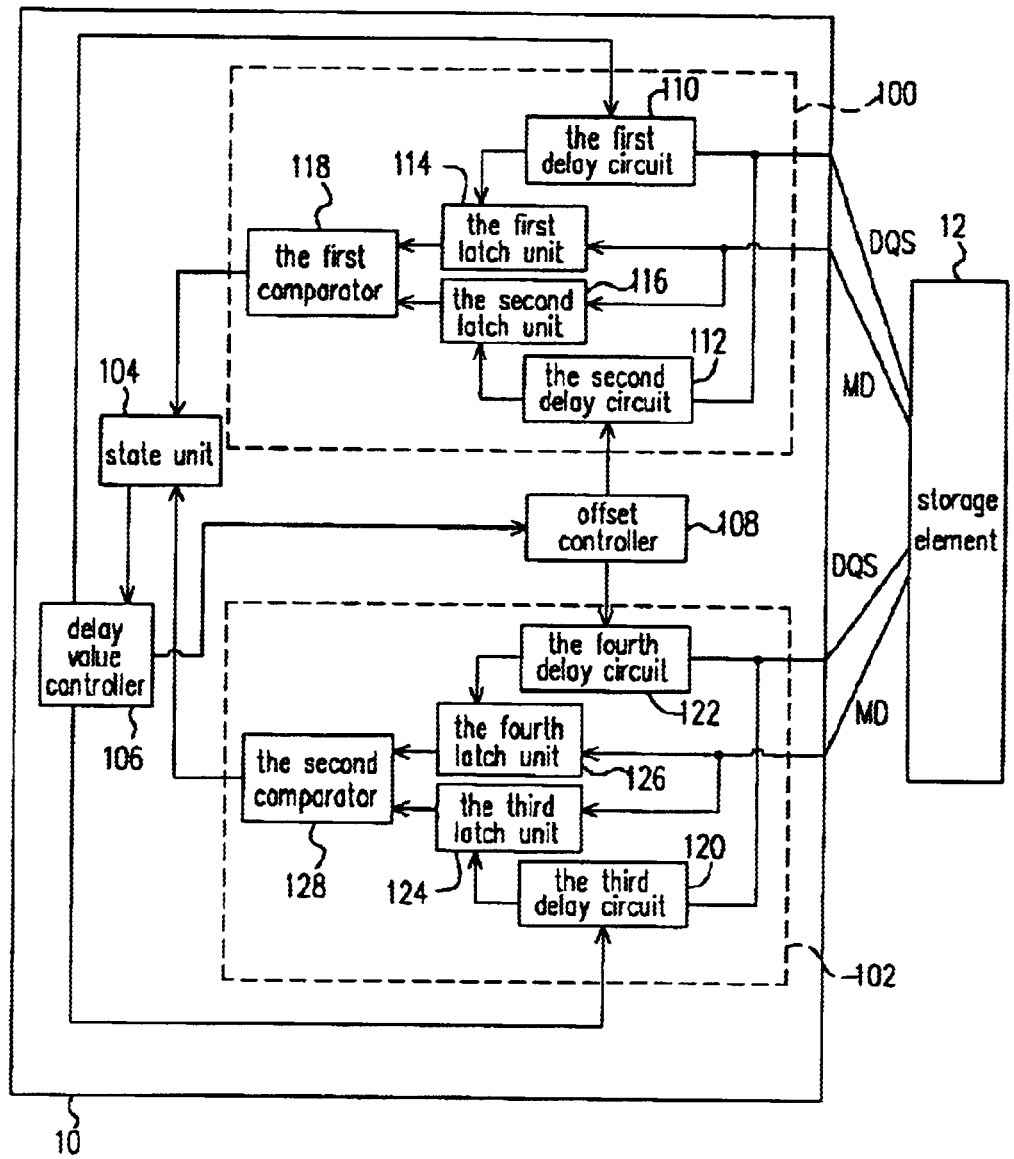
FIG. 2 schematically shows a device for controlling the data latch time of a preferred embodiment according to the present invention.

Please refer to FIG. 2, it schematically shows a block diagram of a device for controlling the data strobe signal DQS latch time of a preferred embodiment according to the present invention. The control chip 10 couples to the storage element 12, receives the data strobe signal (DQS[8:0], abbreviated as DQS) and the memory data signal (MD [71:0], abbreviated as MD) of the storage element 12, delays the data strobe signal DQS[8:0] according to the controlled delay value to latch the data signal (in the present invention, the greater the delay control value is, the longer the data strobe signal delay time will be). The control chip 10 comprises a back edge data comparison circuit 100, a front edge data comparison circuit 102, a state unit 104, a delay value controller 106, and an offset controller 108. Wherein, the back edge data comparison circuit 100 comprises a first delay circuit 110, a second delay circuit 112, a first latch unit 114, a second latch unit 116, and a first comparator 118. The front edge data comparison circuit 102 comprises a third delay circuit 120, a fourth delay circuit 122, a third latch unit 124, a fourth latch unit 126, and a second comparator 128.

As long as the layout of the motherboard is finished, the whole wiring length for connecting the control chip 10 to the storage element 12 can be determined. Wherein, the conditions of one data strobe signal DQS wire and one corresponding memory data signal MD wire respectively selected by the back edge data comparison circuit 100 and the front edge data comparison circuit 102 are determined by the one which has maximum variance after the subtraction of the total wiring length for both circuits. Moreover, the data strobe signal DQS wire of the back edge data comparison circuit 100 is longer than the corresponding memory data signal MD wire. Contrarily, the data strobe signal DQS wire of the front edge data comparison circuit 102 is shorter than the corresponding memory data signal MD wire.

For example, after the layout of the motherboard finishes, it is assumed that the wiring length of the corresponding MD7 subtracted from the wiring length of DQS0 has the maximum variance. Therefore, the back edge data comparison circuit 100 selects DQS0 and MD7. Moreover, the wiring length of corresponding DQS8 subtracted from the wiring length of MD71 that is selected from a plurality of wirings has maximum variance, so the front edge data comparison circuit 102 selects DQS8 and MD71. Hereinafter, although these signals are used for description, the physical selection of the signal wires should be determined based on the physical wiring result.

The operation method of the present invention is suitable for the situation wherein the system suffers from the interference that results from the factors of temperature variance or voltage variance. For example, when the control chip 10 performs the high frequency data access operation, the high temperature of the control chip 10 or the variance range of the operation voltage caused by the high frequency is too big for the control chip 10, resulting in the offset of the read memory data and the strobe signal, thus further impacting the accuracy of the memory data that was accurate originally. In the present embodiment, the delay value controller 106 stores an initial controlled delay value (With regard to the DDR memory, the initial delay value can be set as delayed for ¼ clock period, the initial controlled delay value can be set by BIOS), it also defines an interval of the accurate memory data range, that is the back edge control value and the front edge control value (the read data is confirmed as accurate on the back edge control value and the front edge control value). The back edge control value and the front edge control value can be obtained by adding or subtracting an offset to/from the controlled delay value, respectively.

Then, when the control chip 10 intends to read the memory data in the storage element 12, the control chip 10 issues the memory read command, and further receives the data strobe signal DQS[8:0] and the memory data signal MD[71:0] of the storage element 12. In the present embodiment, the storage element 12 can be the Synchronous Dynamic Random Access Memory (SDRAM), DDR DRAM, or the Buffer Chip. Wherein, the buffer chip is used to modify the access rate of the memory data, so that the control chip 10 can read the memory data with a higher speed.

Afterwards, the back edge data comparison circuit 100 receives DQS0 and MD7. Moreover, the delay value controller 106 uses the initial controlled delay value as the controlled delay value. Then via the first delay circuit 110, the delayed DQS0 is generated (the delay time is determined by the controlled delay value). MD7 is further latched by the first latch unit 114. Moreover, the offset controller 108 adds an offset to the controlled delay value and inputs the result to the second delay circuit 112 to generate the delayed DQS0 (the delay time is determined by a value equal to the offset added to the controlled delay value). MD7 is further latched by the second latch unit 116. The first comparator 118 compares the first latch unit 114 with the second latch unit 116 and outputs the comparison result to the state unit 104.

Similarly, the front edge data comparison circuit 102 receives DQS8 and MD71. Moreover, the delay value controller 106 uses the initial controlled delay value as the controlled delay value. Then via the third delay circuit 120, the delayed DQS8 is generated (the delay time is determined by the controlled delay value). MD71 is further latched by the third latch unit 124. Moreover, the offset controller 108 subtracts an offset from the controlled delay value and inputs the result to the fourth delay circuit 122 to generate the delayed DQS8 (the delay time is determined by a value equals to the offset subtracted from the controlled delay value). MD71 is further latched by the fourth latch unit 126. The second comparator 128 compares the third latch unit 124 with the fourth latch unit 126 and outputs the comparison result to the state unit 104.

When the memory or the control chip suffers from the interference that results from the factors of temperature variance or voltage variance, it results in the offset of the memory data signal MD or the data strobe signal DQS that has just been read, thus causing the inaccurate latch of the memory data signal MD. The state unit 104 can judge the offset status according to the output of the back edge data comparison circuit 100 and the front edge data comparison circuit 102. For example, when the comparison result output from the first comparator 118 differs, it indicates that the delay time of the DQS signal must be pushed backward. Therefore, the state unit 104 will notify the delay value controller 106 to decrease the controlled delay value till the further MD7 data comparison result reaches the equal value.

When the comparison result output from the second comparator 128 differs, it indicates that the delay time of the DQS signal must be pushed forward. Therefore, the state unit 104 will notify the delay value controller 106 to increase the controlled delay value till the further MD71 data comparison result reaches an equal value.

When both the first comparator 118 and the second comparator 128 have error at the same time, it means the offset is too big. Under such circumstances, the offset should be decreased to confirm the read data result first, and further perform the adjustment of the controlled delay value.

In summary, the present invention has the following advantages:

1. It can dynamically adjust the controlled delay value by using the data output from the front edge comparator or the back edge comparator instantly.

2. When the system suffers from the interference that results from the factors of temperature variance or voltage variance resulting in the offset of the data strobe signal or the memory data signal, the control chip of the present invention can instantly adjust the controlled delay value to ensure the accuracy of the read memory data.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A device for controlling a data latch time, comprising:
    a delay value controller, used to provide a controlled delay value;
    a back edge data comparison circuit, receiving a first data strobe signal and a first data signal, wherein the back edge data comparison circuit delays the first data strobe signal and sequentially latches a first data on the first data signal and performs comparison, according to the controlled delay value and a value of a first offset added to the controlled delay value;
    a front edge data comparison circuit, receiving a second data strobe signal and a second data signal, wherein the front edge data comparison circuit delays the second data strobe signal and sequentially latches a second data on the second data signal and performs comparison, according to the controlled delay value and a value of a second offset subtracted from the controlled delay value; and
    a state unit, used to receive a first comparison result of the front edge comparator circuit and a second comparison result of the back edge comparator circuit to make a decision and to provide the decision to the delay value controller for dynamically adjusting the controlled delay value.

2. The device for controlling the data latch time of claim 1, wherein the wiring length of the first data strobe signal is greater than the wiring length of the first data signal.

3. The device for controlling the data latch time of claim 2, wherein the wiring length of the first data signal subtracted from the wiring length of the first data strobe signal has maximum variance.

4. The device for controlling the data latch time of claim 1, wherein the wiring length of the second data strobe signal is less than the wiring length of the second data signal.

5. The device for controlling the data latch time of claim 4, wherein the wiring length of the second data strobe signal subtracted from the wiring length of the second data signal has maximum variance.

6. The device for controlling the data latch time of claim 1, wherein the back edge data comparison circuit comprises:
    a first delay circuit, used to delay the first data strobe signal for a duration equal to the controlled delay value and to send out a first delayed strobe signal;
    a second delay circuit, used to delay the first data strobe signal for a duration equal to the first offset added to the controlled delay value and to send out a second delayed strobe signal;
    a first latch unit, used to latch the first data signal according to the first delayed strobe signal and to send out a first input data signal;
    a second latch unit, used to latch the first data signal according to the second delayed strobe signal and to send out a second input data signal; and
    a first comparator, used to compare the first input data signal with the second input data signal.

7. The device for controlling the data latch time of claim 1, wherein the front edge data comparison circuit comprises:
    a third delay circuit, used to delay the second data strobe signal for a duration equal to the controlled delay value and to send out a third delayed strobe signal;
    a fourth delay circuit, used to delay the second data strobe signal for a duration equal to the second offset subtracted from the controlled delay value and to send out a fourth delayed strobe signal;

a third latch unit, used to latch the second data signal according to the third delayed strobe signal and to send out a third input data signal;

a fourth latch unit, used to latch the second data signal according to the fourth delayed strobe signal and to send out a fourth input data signal; and a second comparator, used to compare the third input data signal with the fourth input data signal.

8. The device for controlling the data latch time of claim 1, wherein, when the comparison result of the back edge comparison circuit is not correct, the delay value controller decreases the controlled delay value.

9. The device for controlling the data latch time of claim 1, wherein, when the comparison result of the front edge comparison circuit is not correct, the delay value controller increases the controlled delay value.

10. A device for controlling a data latch time, comprising:

a delay value controller, used to provide a controlled delay time;

a back edge data comparison circuit, receiving a first data strobe signal and a first data signal, wherein the back edge data comparison circuit delays the first data strobe signal and sequentially latches a first data on the first data signal and performs comparison, according to the controlled delay time and a back edge controlled delay time, wherein the back edge controlled delay time is greater than the controlled delay time by a value of a first offset time;

a front edge data comparison circuit, receiving a second data strobe signal and a second data signal, wherein the front edge data comparison circuit delays the second data strobe signal and sequentially latches a second data on the second data signal and performs comparison, according to the controlled delay time and a front edge controlled delay time, wherein the front edge controlled delay time is less than the controlled delay time by a value of a second offset time; and a state unit, used to receive a first comparison result of the front edge comparator circuit and a second comparison result of the back edge comparator circuit to make a decision and to provide the decision to the delay value controller for dynamically adjusting the controlled delay time.

11. The device for controlling the data latch time of claim 10, wherein the wiring length of the first data strobe signal is greater than the wiring length of the first data signal.

12. The device for controlling the data latch time of claim 11, wherein the wiring length of the first data signal subtracted from the wiring length of the first data strobe signal has maximum variance.

13. The device for controlling the data latch time of claim 10, wherein the wiring length of the second data strobe signal is less than the wiring length of the second data signal.

14. The device for controlling the data latch time of claim 13, wherein the wiring length of the second data strobe signal subtracted from the wiring length of the second data signal has maximum variance.

15. The device for controlling the data latch time of claim 10, wherein the back edge data comparison circuit comprises:

a first delay circuit, used to delay the first data strobe signal for a duration equal to the controlled delay time and to send out a first delayed strobe signal;

a second delay circuit, used to delay the first data strobe signal for a duration equal to the back edge controlled delay time and to send out a second delayed strobe signal;

a first latch unit, used to latch the first data signal according to the first delayed strobe signal and to send out a first input data signal;

a second latch unit, used to latch the first data signal according to the second delayed strobe signal and to send out a second input data signal; and a first comparator, used to compare the first input data signal with the second input data signal.

16. The device for controlling the data latch time of claim 10, wherein the front edge data comparison circuit comprises:

a third delay circuit, used to delay the second data strobe signal for a duration equal to the controlled delay time and to send out a third delayed strobe signal;

a fourth delay circuit, used to delay the second data strobe signal for a duration equal to the front edge controlled delay time and to send out a fourth delayed strobe signal;

a third latch unit, used to latch the second data signal according to the third delayed strobe signal and to send out a third input data signal;

a fourth latch unit, used to latch the second data signal according to the fourth delayed strobe signal and to send out a fourth input data signal; and a second comparator, used to compare the third input data signal with the fourth input data signal.

17. The device for controlling the data latch time of claim 10, wherein, when the comparison result of the back edge comparison circuit is not correct, the delay value controller decreases the controlled delay value.

18. The device for controlling the data latch time of claim 10, wherein, when the comparison result of the front edge comparison circuit is not correct, the delay value controller increases the controlled delay value.

19. A method for controlling a data latch time, comprising the steps of:

providing a controlled delay time, used to delay a data strobe signal for a duration of the controlled delay time and to latch a first data on a first data line and a second data on a second data line by using a delayed data strobe signal;

providing a back edge controlled delay time, used to delay the data strobe signal for a duration of the back edge controlled delay time and to latch a third data on the first data line by using a first delayed data strobe signal, wherein the back edge controlled time is greater than the controlled delay time by a value equal to a first offset;

providing a front edge controlled delay time, used to delay the data strobe signal for a duration of the front edge controlled delay time and to latch a fourth data on the second data line by using a second delayed data strobe signal, wherein the front edge controlled time is less than the controlled delay time by a value equal to a second offset;

wherein when the first data is not equal to the third data, decreasing the delay control time; and wherein when the second data is not equal to the fourth data, increasing the delay control time.

20. The method for controlling the data latch time of claim 19, wherein the wiring length of the first data strobe signal is greater than the wiring length of the first data signal.

21. The method for controlling the data latch time of claim 20, wherein the wiring length of the first data signal subtracted from the wiring length of the first data strobe signal has maximum variance.

22. The method for controlling the data latch time of claim 19, wherein the wiring length of the second data strobe signal is less than the wiring length of the second data signal.

23. The method for controlling the data latch time of claim 22, wherein the wiring length of the second data strobe signal subtracted from the wiring length of the second data signal has maximum variance.

24. A method for controlling a data latch time, used in a data effective duration, comprising the steps of:

provided a front edge controlled delay time, used to delay a data strobe signal for a duration of the front edge controlled delay time and to latch a first data on a data line by using a first delayed data strobe signal;

providing a controlled delay time, used to delay the data strobe signal for a duration of the controlled delay time and to latch a second data on the data line, wherein the front edge controlled time is less than the controlled delay time by a value equal to a first offset time;

providing a back edge controlled delay time, used to delay the data strobe signal for a duration of the back edge controlled delay time and to latch a third data on the data line by using a second delayed data strobe signal, wherein the back edge controlled time is greater than the controlled delay time by a value equal to a second offset time;

wherein only when the first data is not equal to the second data, increasing the delay control time;

wherein only when the second data is not equal to the third data, decreasing the delay control time; and wherein when the first data is not equal to the second data and the second data is not equal to the third data, decreasing the first offset time and the second offset time.

* * * * *